United States Patent
Wirz et al.

(10) Patent No.: US 12,512,332 B2
(45) Date of Patent: Dec. 30, 2025

(54) ENCAPSULATION WARPAGE REDUCTION FOR SEMICONDUCTOR DIE ASSEMBLIES AND ASSOCIATED METHODS AND SYSTEMS

(71) Applicant: Micron Technology, Inc., Boise, ID (US)

(72) Inventors: Brandon P. Wirz, Boise, ID (US); Liang Chun Chen, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/620,993

(22) Filed: Mar. 28, 2024

(65) Prior Publication Data
US 2024/0266191 A1    Aug. 8, 2024

Related U.S. Application Data

(62) Division of application No. 17/315,588, filed on May 10, 2021, now Pat. No. 11,955,345.

(60) Provisional application No. 63/184,899, filed on May 6, 2021.

(51) Int. Cl.
  *H01L 21/56*    (2006.01)
  *H01L 21/48*    (2006.01)

(52) U.S. Cl.
  CPC .......... *H01L 21/56* (2013.01); *H01L 21/4875* (2013.01); *H01L 21/4878* (2013.01)

(58) Field of Classification Search
  CPC ............................. H01L 21/56; H01L 21/4878
  USPC ........................................................ 438/127
  See application file for complete search history.

(56) References Cited

U.S. PATENT DOCUMENTS

| | | | |
|---|---|---|---|
| 6,173,490 B1 * | 1/2001 | Lee ................. | H01L 21/565 29/841 |
| 8,476,748 B1 | 7/2013 | Darveaux et al. | |
| 2004/0016939 A1 | 1/2004 | Akiba et al. | |
| 2011/0062564 A1 | 3/2011 | Gruenhagen et al. | |

(Continued)

FOREIGN PATENT DOCUMENTS

| CN | 106256018 A | 12/2016 |
|---|---|---|
| CN | 205984899 U | 2/2017 |

(Continued)

OTHER PUBLICATIONS

Office Action issued by CNIPA on Feb. 19, 2025 for Chinese patent application No. 202210474510.7, 10 pages.

*Primary Examiner* — Quoc D Hoang
(74) *Attorney, Agent, or Firm* — Dorsey & Whitney LLP

(57) ABSTRACT

Encapsulation warpage reduction for semiconductor die assemblies, and associated methods and systems are disclosed. In one embodiment, a semiconductor die assembly includes an interface die, a stack of semiconductor dies attached to a surface of the interface die, where the stack of semiconductor dies has a first height from the surface. The semiconductor die assembly also includes an encapsulant over the surface and surrounding the stack of semiconductor dies, where the encapsulant includes a sidewall with a first portion extending from the surface to a second height less than the first height and a second portion extending from the second height to the first height. Further, the first portion has a first texture and the second portion has a second texture different from the first texture.

16 Claims, 11 Drawing Sheets

(56) References Cited

U.S. PATENT DOCUMENTS

| | | |
|---|---|---|
| 2013/0009319 A1* | 1/2013 | Shao .................... H01L 21/565 |
| | | 425/395 |
| 2017/0085228 A1 | 3/2017 | Abdo et al. |
| 2020/0292523 A1 | 9/2020 | Maehara et al. |
| 2022/0359230 A1 | 11/2022 | Wirz et al. |

FOREIGN PATENT DOCUMENTS

| | | |
|---|---|---|
| CN | 106847711 A | 6/2017 |
| CN | 107845613 A | 3/2018 |
| WO | 03061006 A2 | 7/2003 |

* cited by examiner

ENCAPSULATION WARPAGE REDUCTION FOR SEMICONDUCTOR DIE ASSEMBLIES AND ASSOCIATED METHODS AND SYSTEMS

CROSS-REFERENCE TO RELATED APPLICATION(S)

This application is a division of U.S. patent application Ser. No. 17/315,588, filed May 10, 2021, now U.S. Pat. No. 11,955,345, which claims priority to U.S. Provisional Patent Application No. 63/184,899, filed May 6, 2021, the disclosures of which are incorporated herein by reference in their entirety.

TECHNICAL FIELD

The present disclosure generally relates to semiconductor die assemblies, and more particularly relates to reducing encapsulation warpage for semiconductor die assemblies and associated methods and systems.

BACKGROUND

Semiconductor packages typically include a semiconductor die (e.g., memory chip, microprocessor chip, imager chip) mounted on a substrate and encased in a protective covering (e.g., an encapsulating material). The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

Market pressures continually drive semiconductor manufacturers to reduce the size of semiconductor packages to fit within the space constraints of electronic devices. In some semiconductor packages, direct chip attach methods (e.g., flip-chip bonding between the semiconductor die and the substrate) may be used to reduce the footprint of the semiconductor packages. Such direct chip attach methods include directly connecting multiple conductive pillars electrically coupled to the semiconductor die to corresponding conductive structures (e.g., conductive bumps) of the substrate. In this regard, a solder structure may be formed over individual conductive pillars for bonding the conductive pillars to the corresponding conductive structures—e.g., forming interconnects (which may be referred to as joints) that include the conductive pillar, the solder structure, and the conductive bump. Further, an encapsulating material can be applied to protect the semiconductor die.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
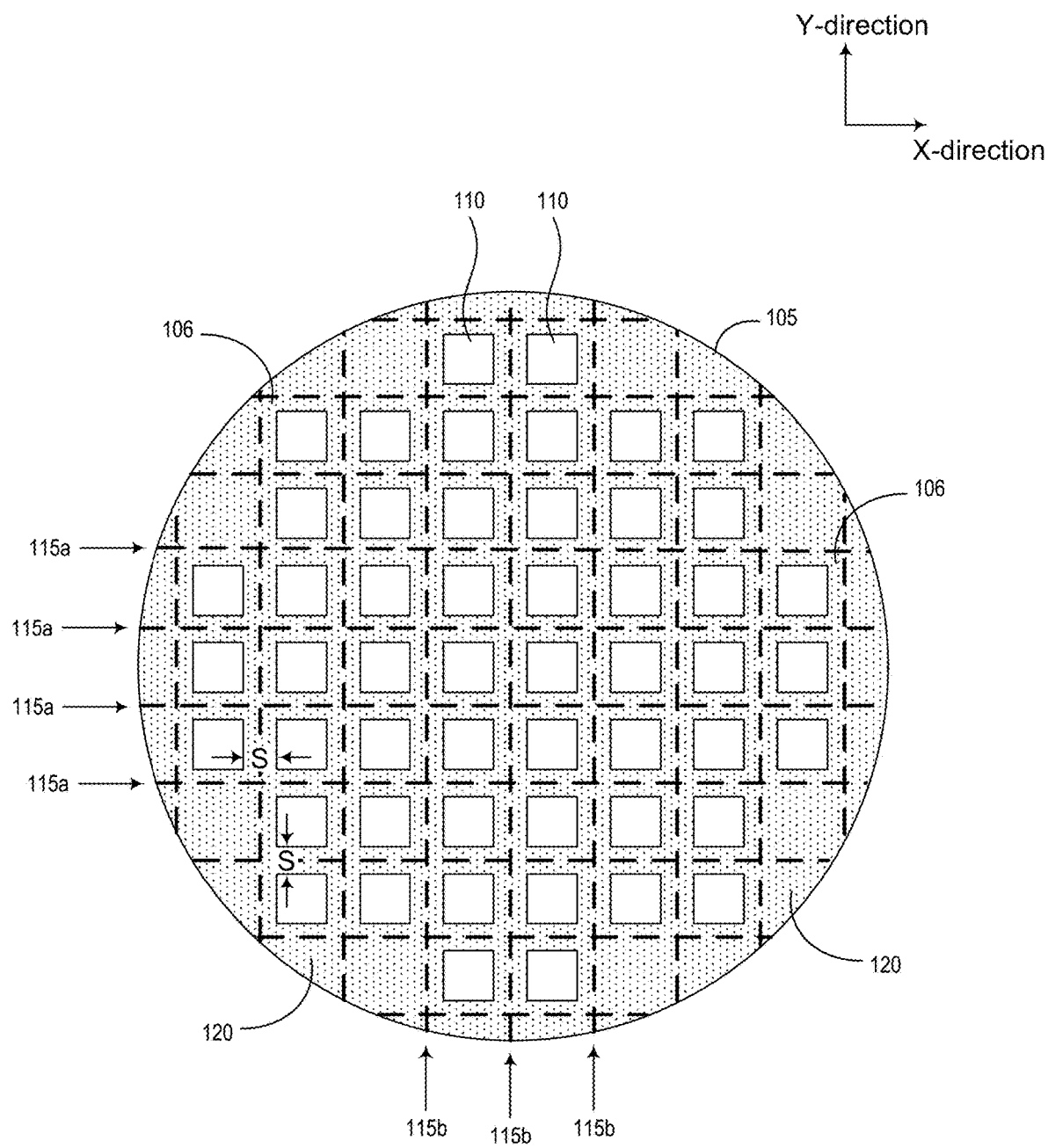
FIG. 1 is a diagram of an interface wafer with stacks of semiconductor dies.

Specific details of several embodiments directed to reducing wafer warpage for semiconductor die assemblies, and associated systems and methods are described below. Wafer level packaging (WLP) can provide scaled form factors for semiconductor die assemblies (semiconductor device assemblies). The WLP techniques utilizes an interface wafer, to which semiconductor dies or stacks of semiconductor dies (e.g., active dies, known good dies, memory dies) are attached. Individual semiconductor dies (or stacks of semiconductor dies) are aligned with and electrically connected to corresponding interface dies of the interface wafer. The interface dies may include different types of semiconductor dies than the semiconductor dies (e.g., logic dies that control the semiconductor dies) or interposer dies with redistribution layers (RDLs) configured to route electrical signals between the semiconductor dies (or the semiconductor dies of the stacks) and higher level circuitry.

For certain semiconductor die assemblies, sizes of individual logic dies and/or interposer dies are greater than areas occupied by corresponding semiconductor dies (or stacks of semiconductor dies) such that additional terminals (e.g., balls in a ball-grid-array (BGA) that are located outside the footprint of the semiconductor dies) are available for the semiconductor dies (or the stacks of semiconductor dies). In this manner, the semiconductor dies can transmit/receive signals via the additional terminals to efficiently handle high bandwidth signals, which may be referred to as a fan-out packaging (FOP) scheme. As such, there are spaces between adjacent semiconductor dies (or adjacent stacks of semiconductor dies), and the spaces correspond to scribe lines (which may also be referred to as dicing lanes, dicing streets, cutting lines, or the like) for the interface dies. A ratio between a total area occupied by the semiconductor dies and a total area of interface wafer may be referred to as a die ratio.

After semiconductor dies (or the stacks of semiconductor dies) have been attached to the interface wafer, which may be referred to as chips on wafer (CoW), an encapsulating material (e.g., mold compound materials, epoxy molding compounds (EMC)) can be disposed over the interface wafer such that the semiconductor dies (or the stacks of semiconductor dies) are immersed in the encapsulating material. Further, the spaces between the semiconductor dies are filled with the encapsulating material. Subsequently, the encapsulating material is cured at an elevated temperature to harden the encapsulating material so as to provide protection for the semiconductor dies. Subsequently, excess encapsulating material above the semiconductor dies (or the stacks of semiconductor dies) may be removed using a grinding process step. The process steps to provide protection for the semiconductor dies using the encapsulating material may be referred to as a molding process.

After the molding process, one or more singulation process steps may follow to singulate (e.g., sever, separate) individual semiconductor die assemblies along the scribe lines. In some embodiments, the singulation process steps utilizes a dicing saw (a singulation blade or saw) to cut the interface wafer and the encapsulating material in the spaces between the semiconductor dies to singulate individual semiconductor die assemblies that each includes an interface die and a semiconductor die (or a stack of semiconductor dies) attached to the interface die.

The encapsulating material typically has a coefficient of thermal expansion (CTE) different from a semiconductor material—e.g., silicon of the semiconductor dies and/or interposer dies. For example, silicon has a CTE of 2.6 ppm/° C. while the encapsulating material may have a CTE of three (3) to four (4) times greater—e.g., CTE values ranging from 7 to 10 ppm/° C., or even greater. Due to the mismatch in the CTE values, the interface wafer carrying the stacks of semiconductor dies experiences stress while the encapsulating material is cured, which may cause the interface wafer to deform (e.g., bowing up or down, warped, distorted). In some cases, the wafer warpage can be exacerbated if the die ratio (a ratio between a total area occupied by the semiconductor dies and a total area of interface wafer) is reduced because of the relatively increased amount of the encapsulating material over the interface wafer. In some case, the wafer warpage can be so severe to cause difficulties in downstream process steps. For example, the wafer warpage may render vacuum chucking of the interface wafer difficult for the grinding process step.

The present technology is devised to reduce (e.g., mitigate) the wafer warpage by reducing the amount of encapsulating material over the interface wafer during the molding process. For example, a mold frame (a mold chase) may include protruded partitions (e.g., ridges, fins, blades, fences, dividers, or the like) that are aligned with the scribe lines of the interface substrate (and thus, aligned with spaces between the semiconductor dies). As described in more detail herein, the protruded partitions reduce a volume of a cavity of the mold frame, which corresponds to the amount of the encapsulating material over the interface wafer. In some embodiments, the protruded partitions displace (e.g., dislodge, extrude, squeeze out, press out) a portion of encapsulating material from the spaces between the semiconductor dies.

As a result, the encapsulating material would include grooves (e.g., impressions, indentations, trenches) along at least some of the scribe lines after the molding process. In this manner, the amount of encapsulating material can be reduced to mitigate the wafer warpage issue stemming from the CTE mismatch while the encapsulating material is cured. In some embodiments, the cavity and the partitions of the mold frame is coated with a material having low surface energy (e.g., Paralyne). In some embodiments, a release film may be inserted between the encapsulating material and the mold frame to facilitate releasing the interface wafer from the mold frame or vice versa. In some embodiments, the mold frame includes one or more openings to provide vacuum suction for the release film.

The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 2A through 5.

As used herein, the terms "vertical," "lateral," "down," "up," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations.

FIG. 1 is a diagram of an interface substrate 105 (or interface wafer) with stacks of semiconductor dies 110. The interface substrate 105 carrying the stacks of semiconductor dies 110 may be referred to as a reconstituted wafer (or chips on wafer) in the context of the WLP technique in view of the singulated, individual semiconductor dies 110 are aligned and attached to corresponding interface dies 106 of the interface substrate 105. Although the present technology is described herein with semiconductor device assemblies including a stack of semiconductor dies (e.g., the stacks of semiconductor dies 110) attached to an interface die (e.g., the interface die 106), it should be understood that the principles of the present technology is not limited thereto. For example, semiconductor device assemblies in accordance with the present technology may include a single semiconductor die attached to an interface die.

In some embodiments, the interface dies 106 are different types of semiconductor dies (e.g., logic dies, controller dies) than the semiconductor dies 110 (e.g., memory dies) of the stacks. The logic dies can be configured to exchange electrical signals with the semiconductor dies 110 and with higher level circuitry (e.g., a host device) coupled with the logic dies. In some embodiments, the interface dies 106 are interposer dies having various conductive structures (e.g., redistribution layers, vias, interconnects) configured to route electrical signals between the stacks of semiconductor dies 110 and higher level circuitry—e.g., a central processing unit (CPU) coupled with the stacks of semiconductor dies 110 through the interposer dies.

The stacks of semiconductor dies 110 include semiconductor dies 110 stacked on top of each other. Each semiconductor die 110 of the stack has a frontside (e.g., the active side having integrated circuits, bond pads connected to the integrated circuits, conductive pillars connected to the bond pads, etc.) facing toward the interface die 106, and a backside opposite to the frontside. The uppermost semiconductor die 110 of the stack may be referred to as a top die, and one or more semiconductor dies 110 located between the top die and the interface die 106 may be referred to as core dies.

In some embodiments, after completing frontside wafer processing (e.g., forming the conductive pillars), core wafers (wafers including the core dies) are temporarily bonded to carrier wafers such that the core wafers can be thinned to expose vias of the core dies (e.g., through substrate vias (TSVs)) from the backside. Subsequently, various backside conductive structures (e.g., conductive bumps connected to the exposed vias) are formed for the core dies. Then, the core dies are diced and stacked on the interface substrate 105 along with the top die (e.g., using thermo compression bonding steps) to generate the reconstituted wafer as illustrated in FIG. 1. The process steps used for generating the interconnect structures (e.g., forming conductive pillars on the frontside, thinning the wafers from the backside, forming the conductive bumps on the backside) can be applied to the interface substrate 105 such that appropriate interconnect structures can be formed on the frontside and/or backside of the interface dies 106. The top dies of the stack, however, may be thicker than the core dies and may not have backside conductive structures (or TSVs).

As the stacks of semiconductor dies 110 are aligned with the interface dies 106 of the interface substrate 105, spaces (denoted as "S" in FIG. 1) between the stacks of semiconductor dies 110 correspond to scribe lines 115 of the interface substrate 105. The scribe lines 115 include horizontal scribe lines 115a along the x-direction and vertical scribe lines 115b along the y-direction. As such, the spaces between the stacks of semiconductor dies 110 may form channels in both x-direction and y-direction for an encapsulating material to flow during the molding process as described below with reference to FIGS. 2A and 3A.

A die ratio may be defined as a ratio between a total area occupied by the stacks of semiconductor dies 110 attached to the interface substrate 105 and a total area of interface substrate 105. If the spaces between the stacks increase, the die ratio would decrease. As a result, if the die ratio decreases, the amount of encapsulating material over the interface substrate 105 would increase rendering the interface substrate 105 subject to increased risk of experiencing wafer warpage during the molding process. In the context of the FOP scheme, the die ratio may be scaled (reduced) due to the difference in area between the stacks of semiconductor dies 110 and the interface dies 106. As such, the wafer warpage issue may be exacerbated in the FOP scheme when compared to the fan-in package (FIP) scheme where the difference in areas between the stacks of semiconductor dies 110 and the interface dies 106 is relatively less. In some cases, independent of the FOP or FIP schemes, the die ratio is determined based on size differences between the stack of semiconductor dies 110 (e.g., dynamic random access memory (DRAM) dies) and the interface die (which may be related to customer package size requirements).

FIG. 1 also depicts that peripheral regions 120 of the interface substrate 105, which are located between outermost stacks of semiconductor dies 110 and the edge of the interface substrate 105. It would be desirable to reduce the encapsulating material over the peripheral regions 120 to mitigate the wafer warpage issue.

Figure 2A:
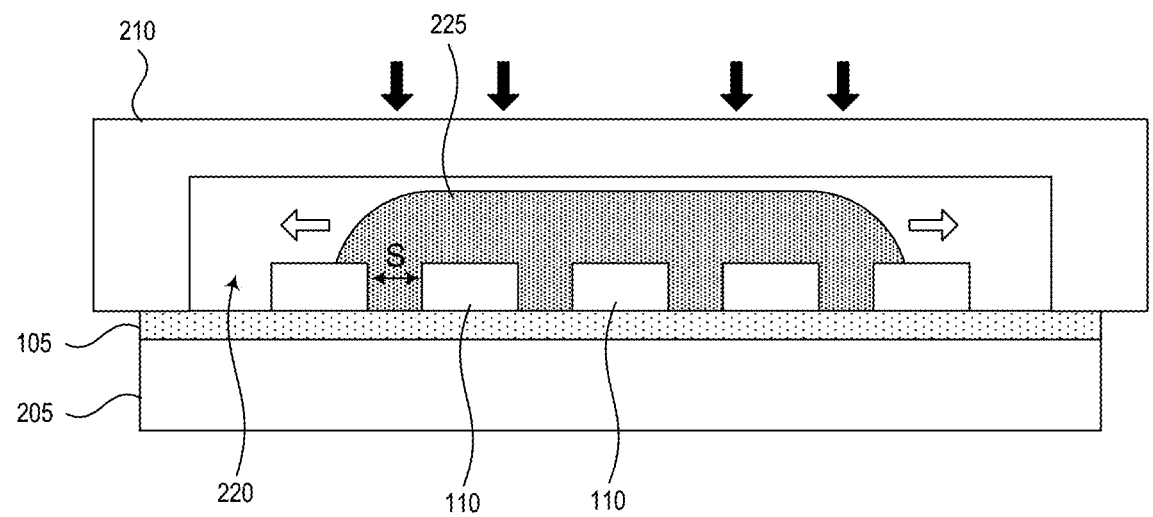
FIGS. 2A through 2E illustrate stages of a process for forming semiconductor die assemblies.

FIGS. 2A through 2E illustrate stages of a process for forming semiconductor die assemblies. FIG. 2A illustrates a cross-sectional view of a support substrate 205 temporarily bonded to the interface substrate 105 carrying the stacks of semiconductor dies 110 attached thereto. The interface substrate 105 may have been thinned as described above with reference to FIG. 1. FIG. 2A also illustrates a mold frame 210 with a cavity 220 and an encapsulating material 225 disposed above the interface substrate 105. The mold frame 210 may be configured to bring the cavity 220 toward the interface substrate 105 (as indicated by dark vertical arrows) such that the encapsulating material 225 can be pressed to spread (as indicated by light horizontal arrows) across the interface substrate 105. In some embodiments, the encapsulating material 225 may be heated to facilitate spreading of the encapsulating material 225 across the interface substrate 105.

Figure 2B:
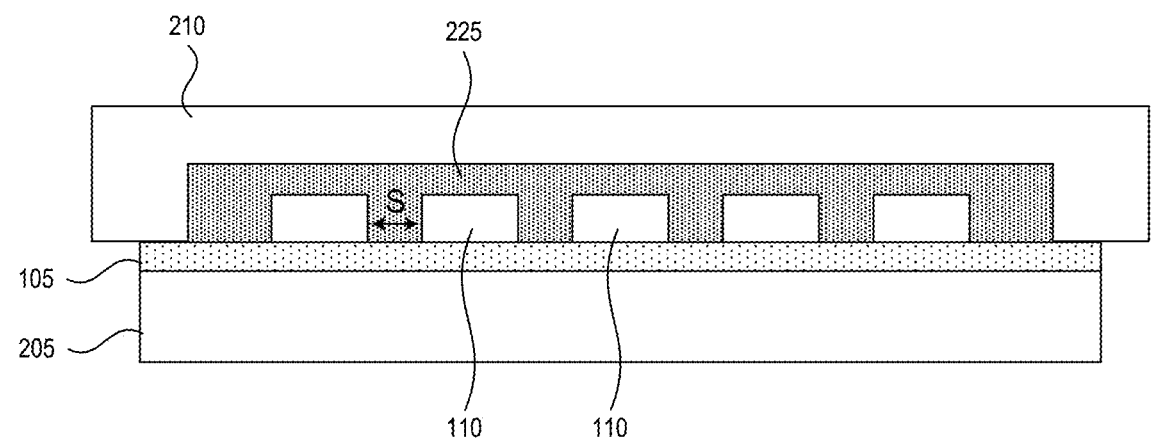

FIG. 2B illustrates the encapsulating material 225 pressed by the mold frame 210 such that the stacks of semiconductor dies 110 are completely enclosed within the encapsulating material 225 and spaces S (corresponding to the scribe lines 115) between the stacks of semiconductor dies 110 are filled with the encapsulating material 225. As the mold frame 210 presses the encapsulating material 225, the encapsulating material 225 may spread across the interface substrate 105 via the spaces S between the stacks of semiconductor dies 110—e.g., the channels along both x-direction and y-direction described with reference to FIG. 1.

Figure 2C:
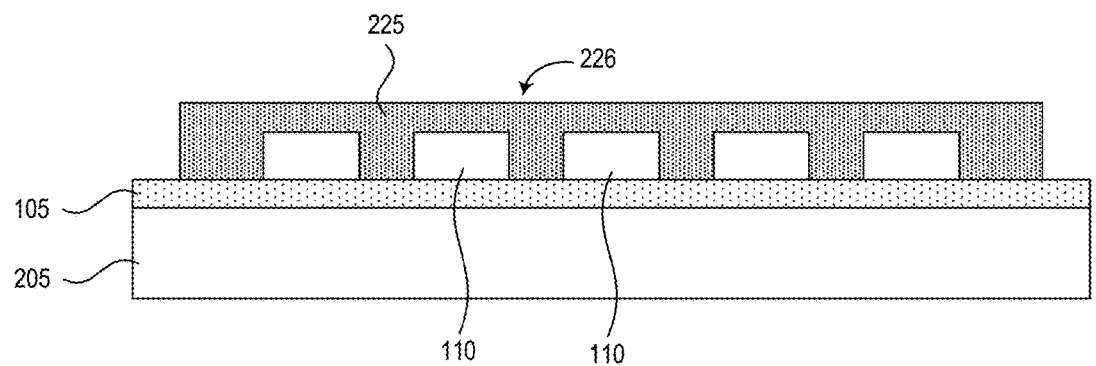

FIG. 2C illustrates the encapsulating material 225 covering the stacks of semiconductor dies 110 attached to the interface substrate 105 after the mold frame 210 is removed—i.e., after the interface substrate 105 is released from the mold frame 210. At this process stage, the stacks of semiconductor dies 110 are completely immersed below a surface 226 of the encapsulating material 225. The surface 226 is flat without any surface features and the encapsulating material 225 covers the entire interface substrate 105 except at the edge of the interface substrate 105. Subsequently, the encapsulating material 225 may be cured at an elevated temperature to harden the encapsulating material 225 to provide protection for the stacks of semiconductor dies 110. The interface substrate 105 may be subject to the wafer warpage issue at least partially due to the stress induced by the CTE mismatch between the encapsulating material 225 and the interface substrate 105.

Figure 2D:
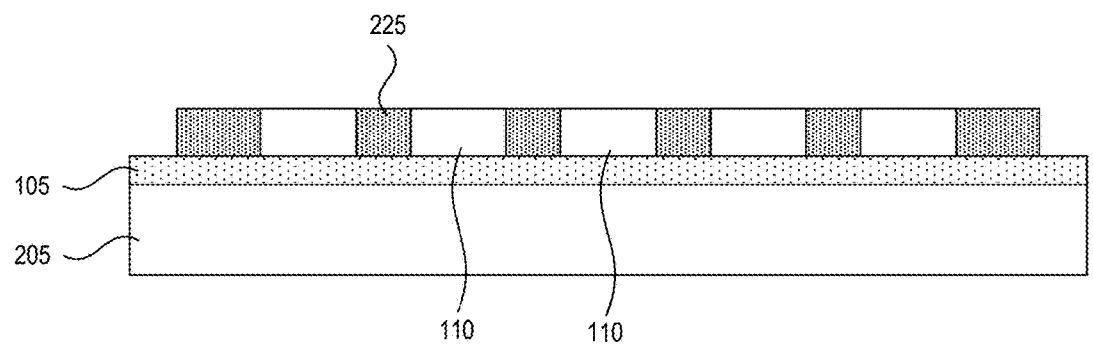

FIG. 2D illustrates the interface substrate 105 carrying the stacks of semiconductor dies 110 after a grinding process removes excess encapsulating material 225 above the stacks of semiconductor dies 110 to expose the top dies of the stacks. In some embodiments, portions of the top dies may also be removed during the grinding process. In some cases, the wafer warpage may be severe enough for the grinding process tool to experience difficulties in handling the interface substrate 105—e.g., wafer chucking issues due to deteriorated vacuum suction. Such difficulties may create non-uniform process conditions within the interface substrate 105 resulting in yield loss—e.g., due to non-uniform removal of the encapsulating material 225. In some cases, the interface substrate 105 may be discarded (scrapped).

Figure 2E:
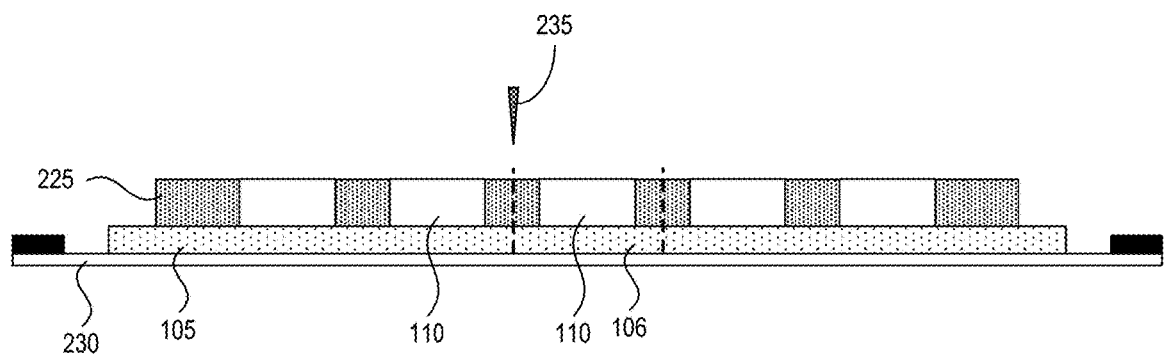

FIG. 2E illustrates the interface substrate 105 carrying the stacks of semiconductor dies 110 separated from the support substrate 205 and placed on a mount tape 230. Subsequently, individual interface dies 106 attached to corresponding stacks of semiconductor dies 110 may be singulated using a singulation blade 235 (or dicing blade) along the scribe lines.

Figure 3A:
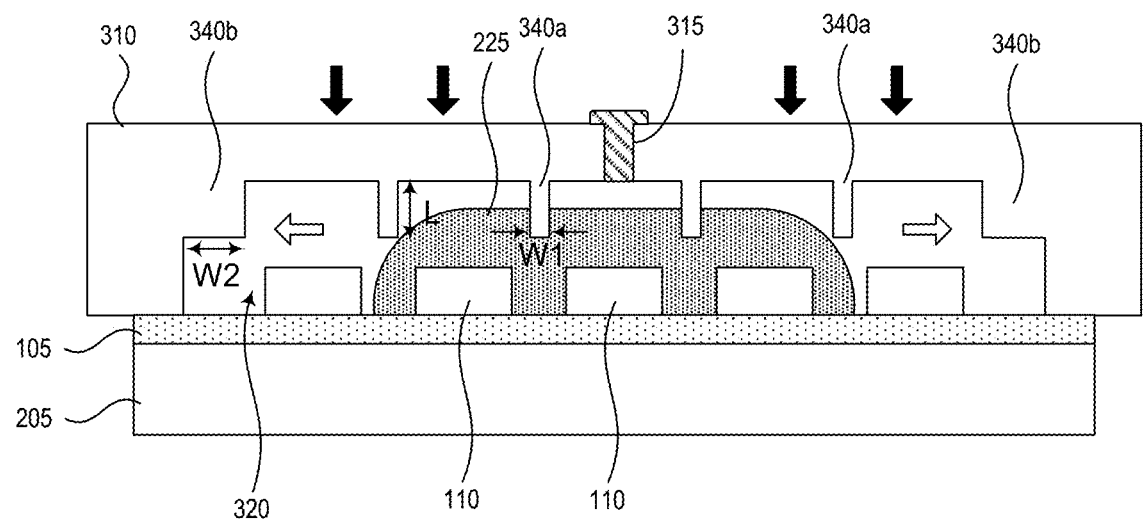
FIGS. 3A through 3F illustrate stages of a process for forming semiconductor die assemblies in accordance with embodiments of the present technology.

FIGS. 3A through 3F illustrate stages of a process for forming semiconductor die assemblies in accordance with the present technology. FIG. 3A illustrates generally similar features of FIG. 2A. For example, FIG. 3A illustrates a cross-sectional view of the support substrate 205 (e.g., a carrier wafer) temporarily bonded (e.g., through an adhesive material, not shown) to the interface substrate 105 carrying the stacks of semiconductor dies 110 attached thereto. The interface substrate 105 may have been thinned as described above with reference to FIG. 1.

FIG. 3A also illustrates a mold frame 310 (which may include aspects of the mold frame 210 described with reference to FIG. 2A) and an encapsulating material 225 (e.g., epoxy molding compounds (EMC), mold compound materials). The mold frame 310 includes a cavity 320, which may have a depth of approximately 1.1 mm from the interface substrate 105. In some embodiments, the encapsulating material 225 is injected into the cavity 320 through an opening 315 of the mold frame 310 after the mold frame 310 is positioned over the interface substrate 105. In this regard, the opening 315 extends from an exterior surface of the mold frame 310 to the cavity 320 such that the opening 315 can supply the encapsulating material 225 into the cavity 320. Thereafter, the opening 315 may be plugged as shown in FIG. 3A. In other embodiments, the encapsulating material 225 is dispensed over the interface substrate 105 before the mold frame 310 is positioned above the encapsulating material 225. The mold frame 310 may be configured to bring the cavity 320 toward the interface substrate 105 (as indicated by dark vertical arrows) such that the encapsulating material 225 can be pressed to spread (as indicated by light horizontal arrows) across the interface substrate 105. In some embodiments, the encapsulating material 225 may be heated to facilitate spreading of the encapsulating material 225 across the interface substrate 105.

Further, the mold frame 310 includes a plurality of partitions 340 (also identified individually as 340a and 340b) extending from the ceiling of the cavity 320 toward the interface substrate 105. FIG. 3A depicts the mold frame 310 including partitions 340a with a width W1, where each partition 340a corresponds to one of the scribe lines 115 between the stacks of semiconductor dies 110 as described with reference to FIG. 1. Also depicted in FIG. 3A are partitions 340b with a width W2 (different than the width W1), which correspond to the peripheral regions 120 of the interface substrate 105 as described with reference to FIG. 1. The partitions 340b may be merged with the inner sidewall of the cavity 320. It should be appreciated that the cavity 320 has a less volume when compared with the cavity 220 of the mold frame 210 due to the partitions 340a and 340b. Also, the total amount of encapsulating material 225 can be estimated to match the volume of the cavity 320. As such, the amount of encapsulating material 225 present in the cavity 320 is less than the amount of encapsulating material 225 present in the cavity 220, thereby mitigating the wafer warpage issue during the molding process.

Figure 3B:
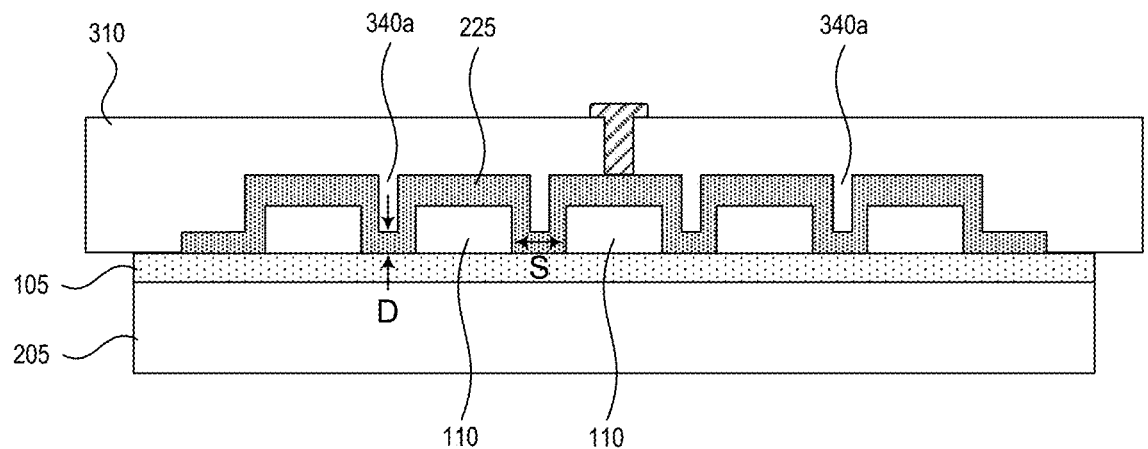

FIG. 3B illustrates the encapsulating material 225 pressed by the mold frame 310 such that the stacks of semiconductor dies 110 are completely enclosed within the encapsulating material 225. As the mold frame 310 presses the encapsulating material 225, the encapsulating material 225 may spread across the interface substrate 105 via the spaces S between the stacks of semiconductor dies 110—e.g., the channels along both x-direction and y-direction described with reference to FIG. 1. Further, the spaces S (corresponding to the scribe lines 115) between the stacks of semiconductor dies 110 are partially filled with the encapsulating material 225 due to the protruded partitions 340a either dislodging portions of the encapsulating material 225 (if the encapsulating material 225 already has filled the spaces as depicted in FIG. 2A) or partially occupying the spaces (if the encapsulating material 225 flows into the spaces).

In this regard, the partitions 340a has a length L determined to position end portions of the partitions 340a past top dies of the stacks of semiconductor dies 110 and above the interface substrate 105 by a distance D. In some embodiments, the distance D is determined for the encapsulating material 225 to spread across the interface substrate 105 through a gap corresponding to the distance D between the interface substrate 105 and the end portions of the partitions 340a. The distance D may range between ten (10) to three hundred (300) micrometers. In some embodiments, a release film (e.g., a release film 565 described with reference to FIG. 5B) may be placed between the cavity 320 and the encapsulant material 225. The release film may facilitate releasing the interface substrate 105 carrying the stacks of semiconductor dies 110 from the mold frame 310.

Figure 3C:
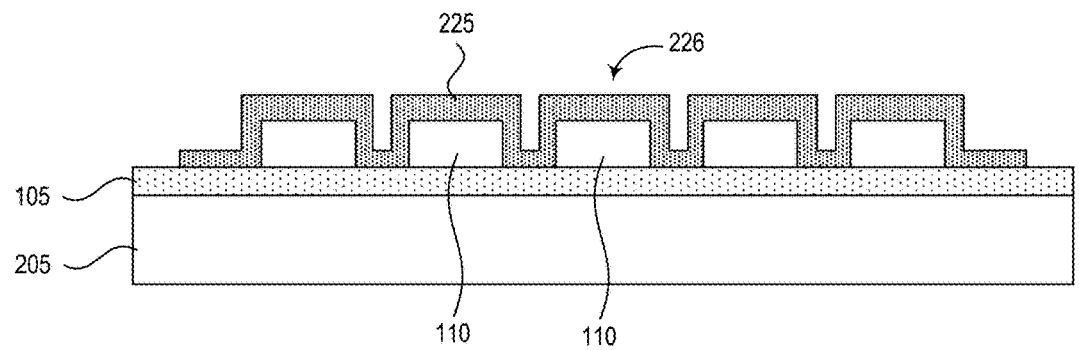

FIG. 3C illustrates the encapsulating material 225 covering (and surrounding) the stacks of semiconductor dies 110 attached to the interface substrate 105 after the mold frame 310 is removed—i.e., after the interface substrate 105 is released from the mold frame 310. At this process stage, a surface 226 of the encapsulating material 225 has impressions (e.g., trenches, grooves, indentations) left by the protruded partitions 340. Subsequently, the encapsulating material 225 may be cured (e.g., cross-linked) at an elevated temperature to harden the encapsulating material 225 to provide protection for the stacks of semiconductor dies 110. The wafer warpage issue can be mitigated because the amount of the encapsulating material 225 over the interface substrate 105 is less than that of the encapsulating material 225 of FIG. 2C due to the protruded partitions 340 occupying a portion of the cavity 320 of the mold frame 310.

Figure 3D:
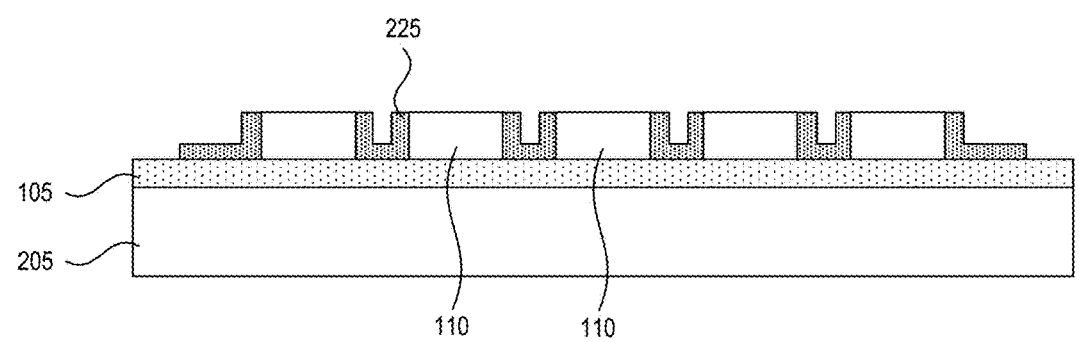

FIG. 3D illustrates the interface substrate 105 carrying the stacks of semiconductor dies 110 after a grinding process removes excess encapsulating material 225 above the stacks of semiconductor dies 110 to expose the top dies of the stacks of semiconductor dies 110. In some embodiments, portions of the top dies may also be removed during the grinding process. The wafer chucking issue (e.g., at the grinding process tool holding the interface substrate 105 by vacuum suction) can be avoided (or at least alleviated) due to the warpage reduction based on the reduced amount of the encapsulating material 225 during the molding process.

Figure 3E:
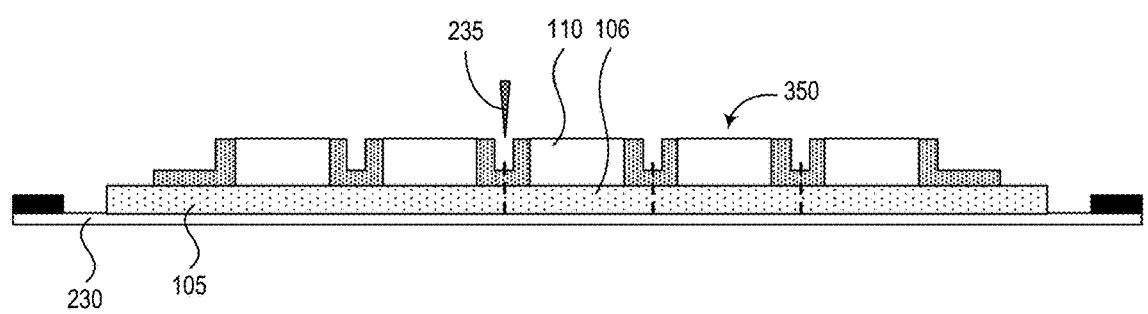

FIG. 3E illustrates the interface substrate 105 carrying the stacks of semiconductor dies 110 separated from the support substrate 205 and placed on a mount tape 230. Subsequently, individual semiconductor die assemblies 350 (i.e., the interface die 106 attached to a stack of semiconductor dies 110 and the encapsulating material 225 surrounding the stack of semiconductor dies 110) may be singulated using one or more singulation process steps. In some embodiments, a singulation blade 235 may be used to cut the encapsulating material 225 and then the interface substrate 105 along the scribe lines 115 described with reference to FIG. 1. Further, it should be appreciated that a distance for the singulation blade 235 to move to sever individual semiconductor die assemblies 350 is reduced (e.g., when compared to the cutting distance depicted in FIG. 2E) due to the spaces between the stacks of semiconductor dies 110 partially filled by the encapsulating material 225 (e.g., when compared to the spaces fully filled by the encapsulating material 225 as depicted in FIG. 2E).

Figure 3F:
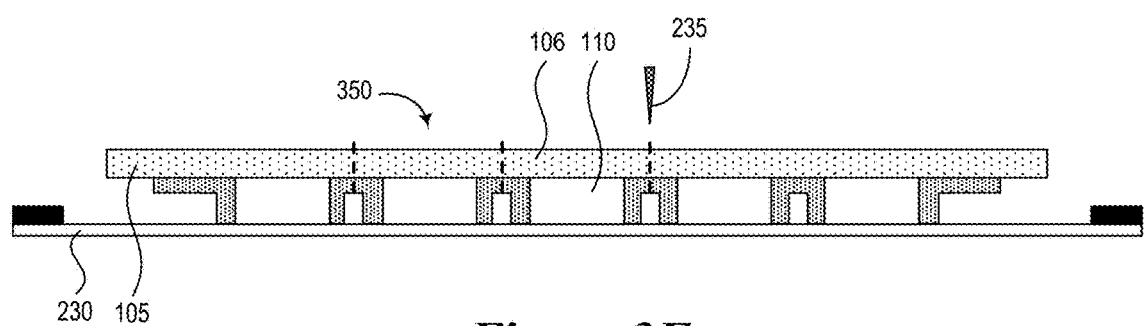

In an alternative embodiment, the mount tape 230 may be placed in contact with the stacks of semiconductor dies 110 (i.e., the interface substrate 105 carrying the stacks of semiconductor dies 110 is rotated by 180 degrees or "flipped") as illustrated in FIG. 3F. Subsequently, individual semiconductor die assemblies 350 may be singulated using the singulation blade 235 to cut the interface substrate 105 and then the encapsulating material 225 along the scribe lines 115 described with reference to FIG. 1.

The process described with reference to FIGS. 3A through 3F may be regarded to include aspects of a compression molding in view of the encapsulating material 225 being pressed into available space within the cavity 320 unoccupied by the stacks of semiconductor dies 110 and the partitions 340. By reducing the volume of the cavity 320 and the amount of encapsulating material 225 during the molding process, wafer warpage can be reduced (mitigated). Also, the present technology may facilitate deploying different encapsulating materials for the semiconductor die assemblies 350—e.g., mold compound materials having other advantages but with greater CTEs.

Although the foregoing descriptions of the present technology illustrate a single stack of semiconductor dies 110 between the partitions 340, the present technology is not limited thereto. For example, two or more stack of semiconductor dies 110 can be positioned between the partitions 340—e.g., 1×2, 2×2, 3×3, 1×2, 1×3, 2×3, or the like. Moreover, the mold frame 310 may include more than one opening (e.g., the opening 315) to facilitate injecting the encapsulating material 225 into the cavity 320. In some embodiments, a single semiconductor die (instead of a stack of semiconductor dies 110) may be attached to the interface die 106.

Figure 4:
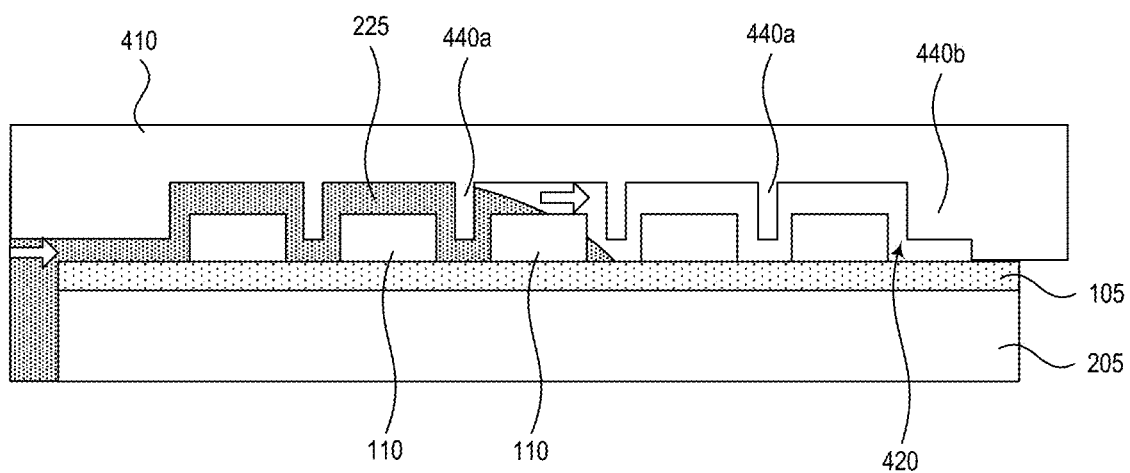
FIG. 4 illustrates a stage of a process for forming semiconductor die assemblies in accordance with embodiments of the present technology.

FIG. 4 illustrates a stage of a process for forming semiconductor die assemblies in accordance with embodiments of the present technology. FIG. 4 illustrates generally similar features of FIG. 3A. For example, FIG. 4 illustrates a cross-sectional view of the support substrate 205 (e.g., a carrier wafer) temporarily bonded to the interface substrate 105 carrying the stacks of semiconductor dies 110 attached thereto. The interface substrate 105 may have been thinned as described above with reference to FIG. 1. Also, FIG. 4 illustrates a mold frame 410 that may include aspects of the mold frame 310 described with reference to FIG. 3A. For example, the mold frame 410 includes partitions 440 (also identified individually as 440a and 440b) and a cavity 420.

In contrast to the mold frame 310 configured to bring the cavity 320 toward the interface substrate 105, the mold frame 410 may be locked into a position above the interface substrate 105 such that the partitions 440a occupy portions of the spaces between the stacks of semiconductor dies 110. Subsequently, the encapsulating material 225 can be injected into the cavity 420 as indicated by the light horizontal arrows. Once the encapsulating material 225 fills available spaces within the cavity 420 unoccupied by the stacks of semiconductor dies 110 and the partitions 440, the interface substrate 105 carrying the stacks of semiconductor dies 110 may follow the process steps described with reference to FIGS. 3C through 3F. As such, the molding process described with reference to FIG. 4 may be regarded to include aspects of a transfer molding process.

Figure 5A:
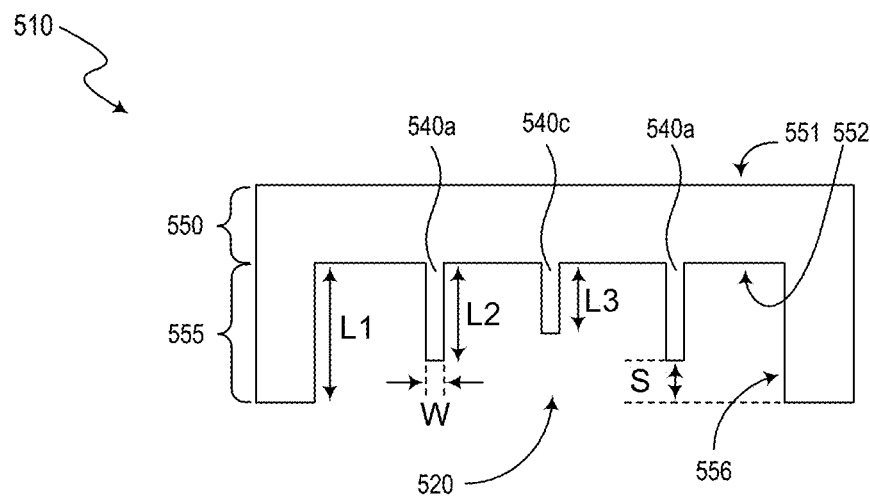
FIGS. 5A and 5B illustrate example mold frames in accordance with embodiments of the present technology.
Figure 5B:
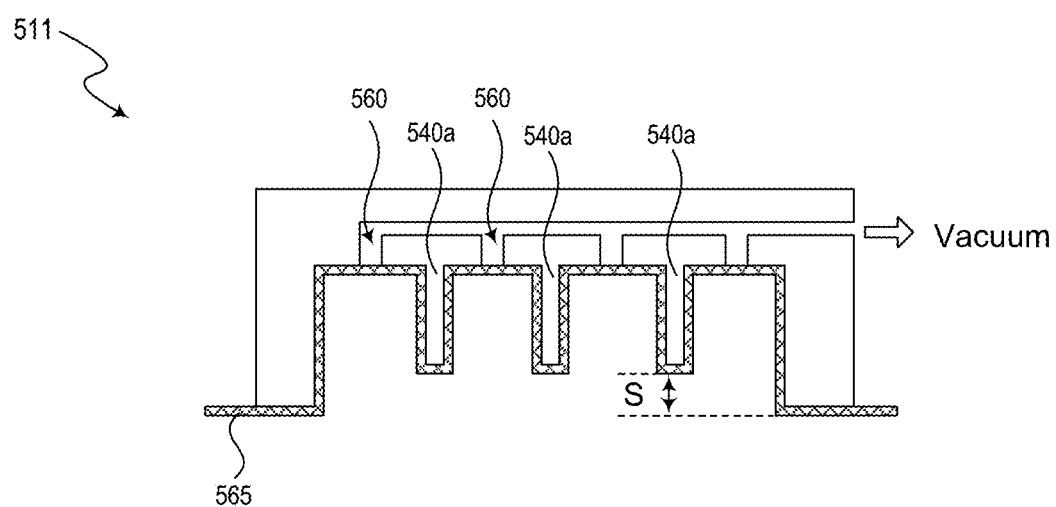

FIGS. 5A and 5B illustrate mold frames (which may be referred to as mold chases) in accordance with embodiments of the present technology. FIG. 5A illustrates a mold frame 510, which may include aspects of mold frames 310 and/or 410 described with reference to FIGS. 3A and 4. The mold frame 510 includes a horizontal member 550 including an exterior surface 551 and an inner surface 552 opposite to the exterior surface 551. The mold frame 510 also includes a wall member 555 connected to a peripheral region of the inner surface 552. The wall member 555 has a first length (denoted as "L1") from the inner surface 552 and includes a cylindrical inner sidewall 556. The inner surface 552 of the horizontal member 550 and the inner sidewall 556 of the wall member 555 form a cavity 520 configured to cover a set of semiconductor die stacks (e.g., the stacks of semiconductor dies 110) attached to a substrate (e.g., the interface substrate 105). Moreover, the inner surface 552 corresponding to the cavity 520 includes a group of protruded partitions 540 (also identified individually as 540a) having a second length (denoted as "L2") from the inner surface 552, where the second length (L2) is less than the first length (L1).

In some embodiments, at least one of the protruded partitions 540 corresponds to a scribe lines of the substrate—e.g., the scribe lines 115 described with reference to FIG. 1. In some embodiments, at least a subgroup of the protruded partitions are arranged to orthogonally intersect each other to form a pattern of rectangles (e.g., the grid pattern depicted in FIGS. 5C and 5D). Further, each rectangle of the pattern (or a single cell of the grid pattern) may correspond to one or more stacks of semiconductor dies as described in more details with reference to FIGS. 5C and 5D. In some embodiments, the inner surface 552 corresponding to the cavity 520, the inner sidewall 556 of the wall member 555, and the group of protruded partitions are coated with a material having low surface energy (e.g., Paralyne).

In some embodiments, the inner surface 552 corresponding to the cavity 520 further includes at least one protruded partition (e.g., 540c) having a third length (denoted as "L3") from the inner surface 552, where the third length (L3) is less than the second length (L2). In some cases, the third length (L3) may be determined to further facilitate spreading of an encapsulating material (e.g., the encapsulating material 225) in a certain region of the substrate—e.g., the central region of the interface substrate 105 where the encapsulating material is initially located as shown in FIG. 3A. In some embodiments, the inner surface 552 corresponding to the cavity 520 further includes at least one protruded partition reaching the surface of the substrate, to which the stacks of semiconductor dies are attached.

In some embodiments, at least one of the protruded partitions 540 has a width (denoted as "W") less than or equal to a width of a singulation blade (e.g., the singulation blade 235). For example, if the interface die 106 has approximately the same width (or length) as the stacks of semiconductor dies 110 (e.g., as in the FIP scheme), maintaining the width of the protruded partitions less than or equal to the width of the singulation blade would be beneficial to avoid increasing the width of the dicing lane. In other embodiments, at least one of the protruded partitions has a width greater than a width of a singulation blade (e.g., the singulation blade 235). For example, if the interface die 106 has greater width (or length) than the stacks of semiconductor dies 110 (e.g., as in the FOP scheme), the width of the protruded partitions can be greater than the width of the singulation blade such that the amount of encapsulating material over the interface substrate 105 (e.g., between the stacks of semiconductor dies 110) can be reduced.

In some embodiments, the mold frame 510 may be modified to include openings 560 as shown in FIG. 5B illustrating a mold frame 511. In this regard, a portion of the inner surface 522 corresponding to a rectangle of the pattern (a cell of the grid pattern) includes at least one opening 560 configured to provide vacuum suction for a release film 565 located in the rectangle. The release film 565 can facilitate releasing the substrate carrying the set of semiconductor die stacks after the encapsulating material fills the cavity as described with reference to FIGS. 3B and 3C. In some embodiments, the release film 565 may be used together with the mold frame 510 (e.g., without the openings 560).

Figure 5C:
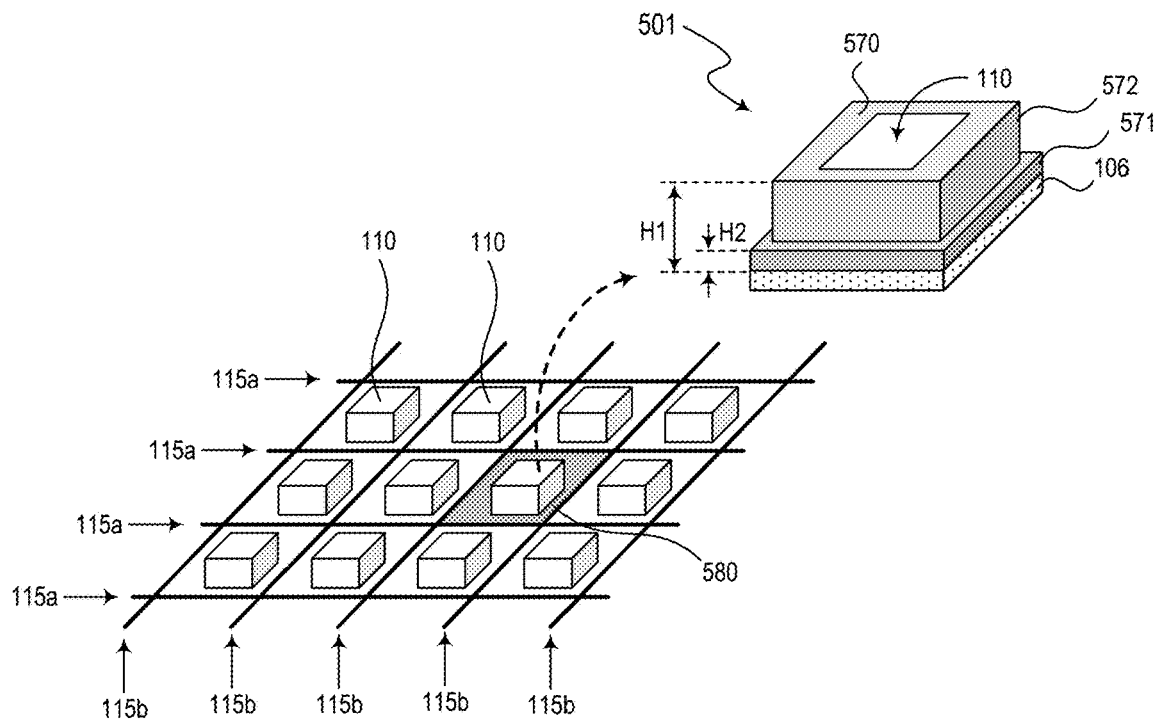
FIGS. 5C and 5D illustrate example semiconductor die assemblies in accordance with embodiments of the present technology.
Figure 5D:
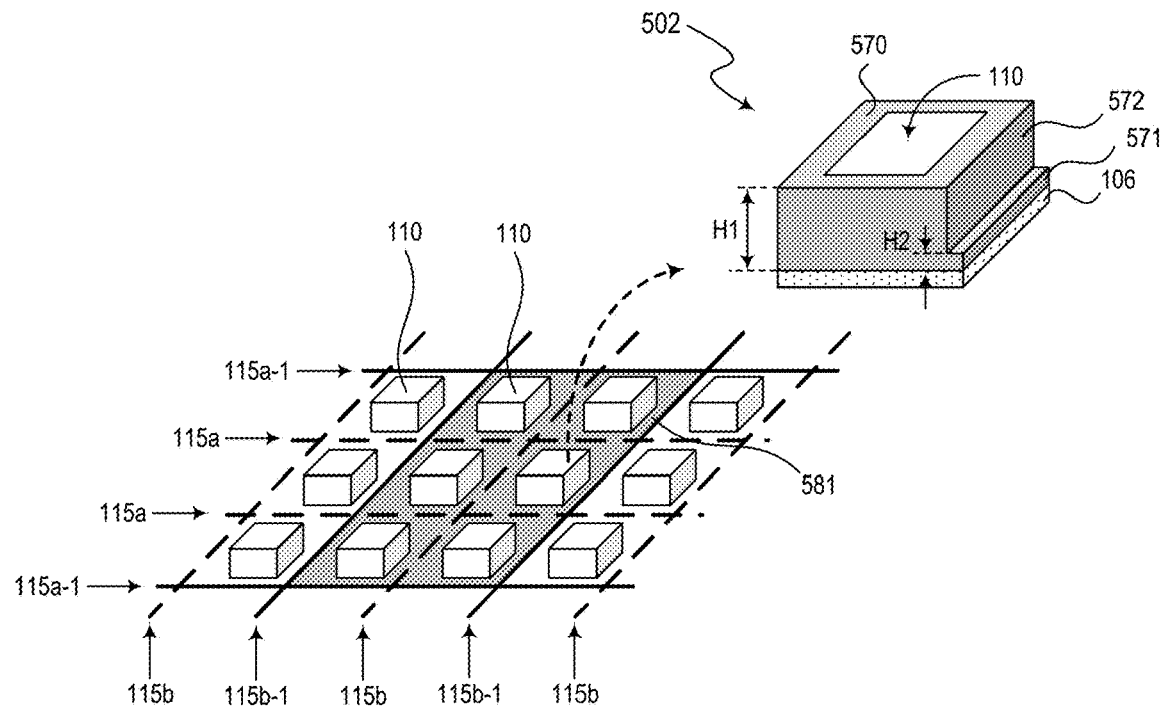

FIGS. 5C and 5D illustrate semiconductor die assemblies 501 and 502, respectively in accordance with embodiments of the present technology. Further, FIGS. 5C and 5D each illustrates an area of an interface wafer carrying stacks of semiconductor dies 110—e.g., the interface substrate 105 described with reference to FIG. 1. The semiconductor die assemblies 501 and 502 may be examples of or include aspects of the semiconductor die assembly 350 described with reference to FIGS. 3E and 3F. For example, the semiconductor die assemblies 501 and 502 each includes a stack of semiconductor dies 110 attached to an interface die 106 and an encapsulant 570. The encapsulant 570 may have a first height (denoted as "H1") from a surface of the interface die 106, which may correspond to a height of the stack of semiconductor dies 110. As described herein, the encapsulant 570 may have different sidewall configurations based on mold frames having different arrangements of the protruded partitions.

In some embodiments, a mold frame (e.g., the mold frame 310, 410, 510, 511) includes protruded partitions that each is aligned with a corresponding scribe line (e.g., the scribe lines 115a in x-direction and the scribe lines 115b in y-direction of FIG. 5C) such that orthogonally intersecting protruded partitions form a grid pattern—e.g., the grid pattern formed by the protruded partitions as depicted in FIG. 5C. As such, a single cell of the grid pattern corresponds to a single semiconductor die assembly (e.g., the semiconductor die assembly 501). For example, FIG. 5C depicts a shaded section 580 corresponding to one of the cells of the grid pattern, which includes the semiconductor die assembly 501 having an interface die 106 and a stack of semiconductor dies 110.

In this manner, after the semiconductor die assemblies 501 has been singulated as described with reference to FIGS. 3E and 3F, each of the four (4) sidewalls of the encapsulant 570 of the semiconductor die assembly 501 includes a first portion 571 (or a lower segment) extending from the surface of the interface die 106 to a second height (denoted as "H2") less than the first height (H1) and a second portion 572 (or an upper segment) extending from the second height to the first height. Further, the first portion 571 may include a first surface texture formed by one or more singulation process steps utilized to singulate the interface die 106 (and the encapsulation material between the stacks of semiconductor dies). In comparison, the second portion 572 may include a second surface texture formed by contact between a mold frame (e.g., the mold frame 310, 410, 510, 511) and the encapsulant 570.

In alternative embodiments, a mold frame (e.g., the mold frame 310, 410, 510, 511) includes protruded partitions aligned with a subset of scribe lines such that a single cell of the grid pattern created by orthogonally intersecting protruded partitions corresponds to more than one semiconductor die assemblies (e.g., 1×2, 2×2, 1×3, 2×3, 3×3 semiconductor die assemblies, or the like). For example, FIG. 5D depicts the subset of scribe lines aligned with the protruded partitions in solid lines (e.g., the scribe lines 115a-1 and the scribe lines 115b-1) and the other scribe lines absent the protruded partitions in broken lines (e.g., the scribe lines 115a and 115b). As such, one of the cells of the grid pattern corresponds to six (6) semiconductor die assemblies included in a shaded section 581. The semiconductor die assembly 502 of FIG. 5D corresponds to one of such semiconductor die assemblies.

When the semiconductor die assemblies are singulated along the scribe lines 115a-1 or 115b-1, the dicing blade 235 severs the encapsulating material partially occupying the spaces between the semiconductor die assemblies as described with reference to FIGS. 3E and 3F. When the semiconductor die assemblies are singulated along the scribe lines 115a or 115b (i.e., scribe lines without corresponding protruded partitions of the mold frame), however, the dicing blade 235 severs the encapsulating material fully occupying the spaces between the semiconductor die assemblies as described with reference to FIG. 2E. In this manner, the semiconductor die assemblies may have an encapsulant (e.g., the encapsulant 570 of the semiconductor die assembly 502) with sidewalls having different configurations.

For example, in addition to a first sidewall including the first portion 571 (or a lower segment) and the second portion 572 (or an upper segment) similar to the semiconductor die assembly 501, the semiconductor die assembly 502 also includes a second sidewall extending straight up from the surface of the interface die 106 to the first height (H1). The second sidewall may have the first surface texture formed by one or more singulation process steps utilized to singulate the interface die 106 (and the encapsulation material between the stacks of semiconductor dies). The first and second sidewalls may not be in the same plane. In other words, the first sidewall is in a first plane, and the second sidewall is in a second plane different from the first plane.

Figure 6:
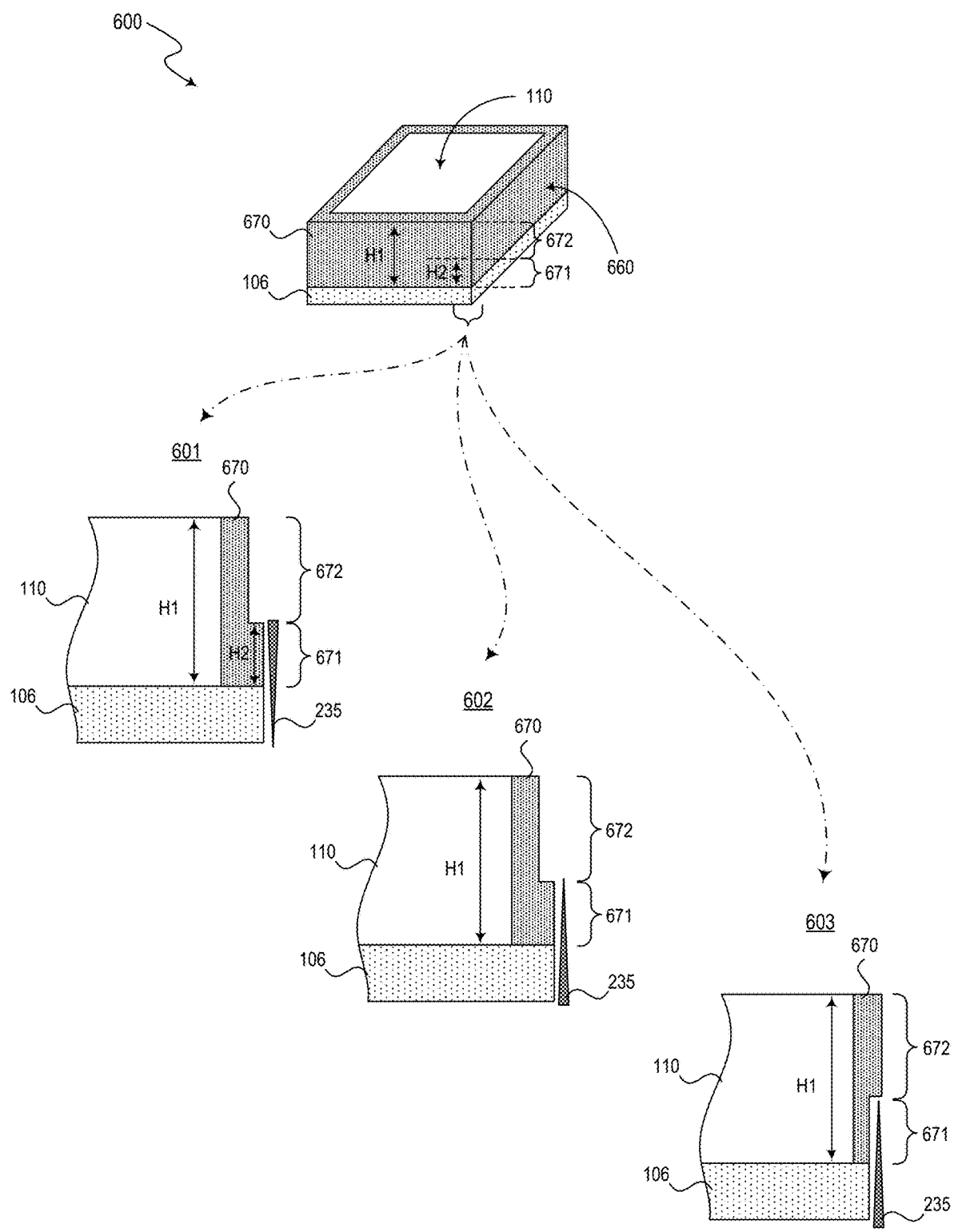
FIG. 6 is a semiconductor die assembly in accordance with embodiments of the present technology.

FIG. 6 is a semiconductor die assembly 600 in accordance with embodiments of the present technology. The semiconductor die assembly 600 may be an example of or include aspects of the semiconductor die assemblies 350, 501, or 502 described with reference to FIGS. 3E, 3F, 5C, and 5D. For example, the semiconductor die assembly 600 includes an interface die (e.g., the interface die 106) and a stack of semiconductor dies (e.g., the stacks of semiconductor dies 110) attached to a surface of the interface die. In some embodiments, the interface die 106 corresponds to a logic die or an interposer die, and the semiconductor dies of the stack correspond to memory dies (e.g., DRAM dies).

The stack of semiconductor dies has a first height (denoted as "H1") from the surface of the interposer die. The semiconductor die assembly 600 also includes an encapsulant 670 (e.g., the encapsulating material 225) over the surface and surrounding the stack of semiconductor dies. Overall height of the encapsulant 670 may correspond to the first height from the surface as a result of the grinding process described with reference to FIG. 3D. Further, the encapsulant 670 includes a sidewall 660 having a first portion 671 (or a lower segment) extending from the surface to a second height (denoted as "H2") less than the first height (H1) and a second portion 672 (or an upper segment) extending from the second height to the first height. Although FIG. 6 illustrates the sidewalls of the encapsulant 670 as straight for a clear illustration of overall features of the present technology, diagrams 601 through 603 of FIG. 6 depict further details of a side view of the sidewall 660 to describe features of the first and second portions (the lower and upper segments).

The diagram 601 may correspond to the semiconductor die assembly 350 depicted in FIG. 3E, where the interface substrate 105 was attached to the mount tape 230 when the dicing blade 235 singulated the semiconductor die assembly 350. The diagram 601 illustrates the dicing blade 235 cutting the encapsulant 670 (e.g., the encapsulating material 225) between the stacks of semiconductor dies 110 prior to cutting the interface substrate 105 to singulate the interface die 106 (hence singulating the semiconductor die assembly 600). As depicted in the diagram 601, the dicing blade 235 leaves the second portion 672 untouched when the dicing process is complete.

The diagram 602 may correspond to the semiconductor die assembly 350 depicted in FIG. 3F, where the stacks of semiconductor dies 110 was attached to the mount tape 230 when the dicing blade 235 singulated the semiconductor die assembly 350. The diagram 602 illustrates the dicing blade 235 cutting the interface substrate 105 prior to cutting the encapsulant 670 (e.g., the encapsulating material 225) between the stacks of semiconductor dies 110 to singulate the interface die 106 (hence singulating the semiconductor die assembly 600). As depicted in the diagram 602, the dicing blade 235 leaves the second portion 672 untouched when the dicing process is complete.

Similarly, the diagram 603 may correspond to the semiconductor die assembly 350 depicted in FIG. 3F, where the stacks of semiconductor dies 110 was attached to the mount tape 230 when the dicing blade 235 singulated the semiconductor die assembly 350. The dicing blade 235 (offset from the grooves or the trenches formed in the encapsulating material 225 described with reference to FIG. 3D) cuts the interface substrate 105 prior to cutting the encapsulant 670 (e.g., the encapsulating material 225) between the stacks of semiconductor dies 110 to singulate the interface die 106 (hence singulating the semiconductor die assembly 600). Since the dicing is complete when the encapsulating material 225 between the stacks of semiconductor dies 110 is removed, the dicing blade 235 leaves the second portion 672 untouched.

In this manner, the sidewall 660 of the encapsulant 670 has a lower segment (e.g., the first portion 671) extending from the surface to the second height (e.g., H2) less than the first height (e.g., H1) and an upper segment (e.g., the second portion 672) extending from the second height to the first height. Further, the lower segment may have a first surface texture (e.g., a surface finish, surface roughness, etc.), and the upper segment may have a second surface texture different from the first surface texture. As depicted in the diagrams 601 through 603, the lower segment is in a first plane and the upper segment is in a second plane different from and parallel to the first plane.

As described herein, the first surface texture can be formed by one or more singulation process steps utilized to singulate the interface die (and to sever the encapsulating material 225 between the adjacent stacks of semiconductor dies 110), and the second surface texture can be formed by contact between a mold frame (e.g., the mold frame 310, 410, 510, 511) and the encapsulant 670. As such, the second surface texture may exhibit relatively cleaner impressions (or imprints) of the mold frame than the first surface texture that may exhibit relatively rough traces of the dicing blade 235 cutting the encapsulant 670. In this manner, the second surface texture may be generally smoother than the first surface texture. Moreover, as the dicing blade 235 cuts the first portion 671 of the encapsulant 670 along with the interface die 106, the first portion 671 (the lower segment) of the encapsulant 670 is aligned with an edge of the interface die 106.

Figure 7:
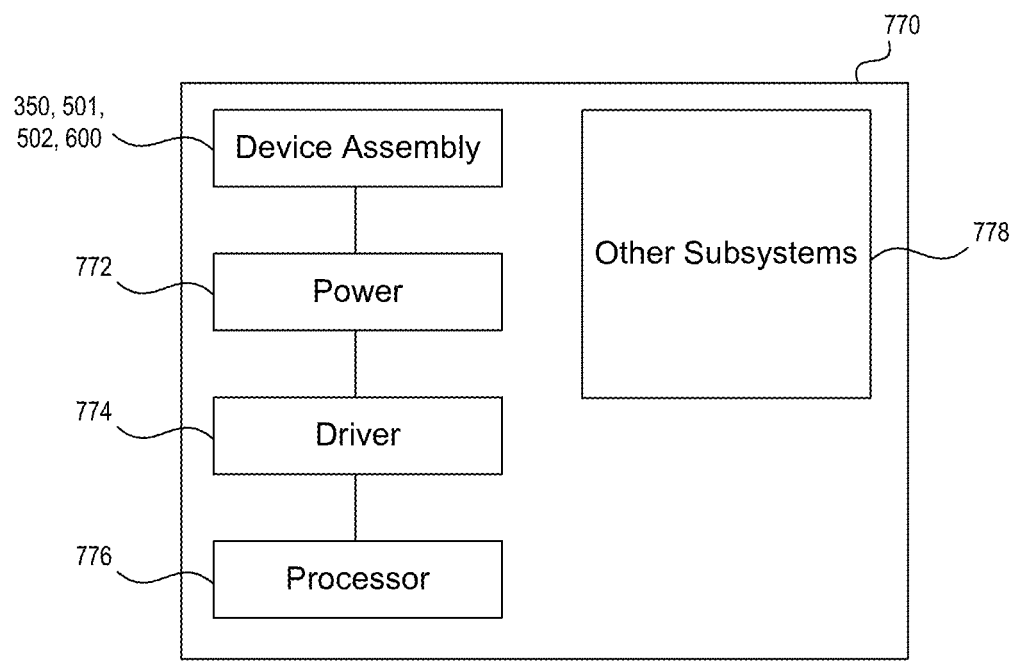
FIG. 7 is a block diagram schematically illustrating a system including a semiconductor die assembly configured in accordance with embodiments of the present technology.

The semiconductor die assemblies 350, 501, 502, and 600 described with reference to FIGS. 3E, 3F, 5C, 5D, and 6 can be incorporated into any of a myriad of larger and/or more complex systems, a representative example of which is the system 770 shown schematically in FIG. 7. The system 770 can include the semiconductor die assembly 350, 501, 502, or 600, a power source 772, a driver 774, a processor 776, and/or other subsystems or components 778. The semiconductor die assembly 350, 501, 502, or 600 can include features generally similar to those with reduced wafer warpage described above. In other words, the semiconductor die assembly 350, 501, 502, or 600 includes an encapsulant having at least one sidewall with two portions having different surface finishes (e.g., surface roughness). The resulting system 770 can perform any of a wide variety of functions, such as memory storage, data processing, and/or other suitable functions. Accordingly, representative systems 770 can include, without limitation, hand-held devices (e.g., mobile phones, tablets, digital readers, and digital audio players), computers, and appliances. Components of the system 770 may be housed in a single unit or distributed over multiple, interconnected units (e.g., through a communications network). The components of the system 770 can also include remote devices and any of a wide variety of computer readable media.

Figure 8:
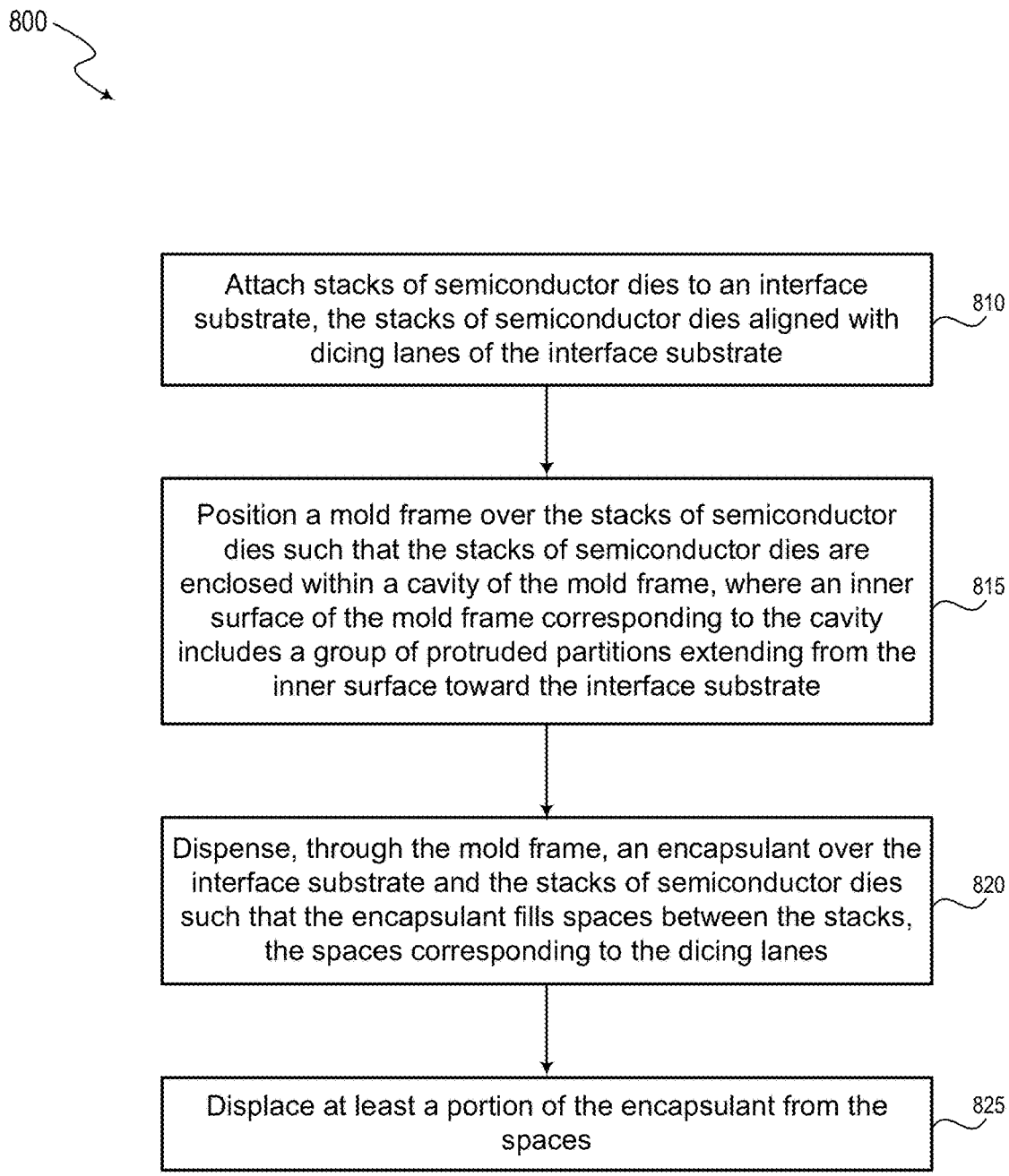
FIG. 8 is a flowchart of a method of forming a semiconductor die assembly in accordance with embodiments of the present technology.

FIG. 8 is a flowchart 800 of a method of forming a semiconductor die assembly (e.g., the semiconductor die assemblies 350 or 600) in accordance with embodiments of the present technology. The flowchart 800 may include aspects of methods as described with reference to FIGS. 3A-3F.

The method includes attaching stacks of semiconductor dies to an interface substrate, the stacks of semiconductor dies aligned with dicing lanes of the interface substrate (box 810). The method further includes positioning a mold frame over the stacks of semiconductor dies such that the stacks of semiconductor dies are enclosed within a cavity of the mold frame, where an inner surface of the mold frame corresponding to the cavity includes a group of protruded partitions extending from the inner surface toward the interface substrate (box 815). The method further includes dispensing, through the mold frame, an encapsulant over the interface substrate and the stacks of semiconductor dies such that the encapsulant fills spaces between the stacks, the spaces corresponding to the dicing lanes (box 820). The method further includes displacing at least a portion of the encapsulant from the spaces (box 825).

In some embodiments, displacing the at least the portion of the encapsulant includes pressing the mold frame toward the interface substrate such that the protruded partitions dislodges the at least the portion of the encapsulant from the spaces. In some embodiments, the method further includes placing a release film between the cavity and the encapsulant, where the protruded partitions are arranged to orthogonally intersect each other to form a pattern of rectangles that each corresponds to one or more stacks of semiconductor dies, and a portion of the inner surface corresponding to a rectangle of the pattern includes at least one opening configured to provide vacuum suction to the release film.

It should be noted that the methods described above describe possible implementations, and that the operations and the steps may be rearranged or otherwise modified and that other implementations are possible. Furthermore, embodiments from two or more of the methods may be combined. Further, it will be appreciated that specific embodiments of the technology have been described herein for purposes of illustration, but that various modifications may be made without deviating from the disclosure.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A mold frame, comprising:
   a horizontal member including an exterior surface and an inner surface opposite to the exterior surface; and
   a wall member connected to a peripheral region of the inner surface, the wall member having a first length from the inner surface and including a concave cylindrical inner sidewall, wherein:
      the inner surface of the horizontal member and the inner sidewall of the wall member define a cavity configured to cover a plurality of semiconductor dies attached to a substrate; and
      the inner surface corresponding to the cavity includes a group of protruded partitions having a second length from the inner surface, the second length being less than the first length.

2. The mold frame of claim 1, wherein at least one of the protruded partitions corresponds to a scribe line of the substrate.

3. The mold frame of claim 1, wherein at least a subgroup of the protruded partitions are arranged to orthogonally intersect each other to form a pattern of rectangles.

4. The mold frame of claim 3, wherein each rectangle of the pattern corresponds to one or more semiconductor dies of the plurality of semiconductor dies.

5. The mold frame of claim 3, wherein a portion of the inner surface corresponding to a rectangle of the pattern includes at least one opening configured to provide vacuum suction for a release film located in the rectangle.

6. The mold frame of claim 1, wherein the inner surface corresponding to the cavity, the inner sidewall of the wall member, and the group of protruded partitions are coated with a material having low surface energy.

7. The mold frame of claim 1, wherein the protruded partitions are first protruded partitions, and the inner surface corresponding to the cavity further includes at least one second protruded partition having a third length from the inner surface, the third length being less than the second length.

8. The mold frame of claim 1, wherein at least one of the protruded partitions has a width greater than a width of a singulation blade.

9. The mold frame of claim 1, wherein at least one of the protruded partitions has a width less than or equal to a width of a singulation blade.

10. A method, comprising:
    attaching stacks of semiconductor dies to an interface substrate, the stacks of semiconductor dies aligned with dicing lanes of the interface substrate;
    positioning a mold frame over the stacks of semiconductor dies such that the stacks of semiconductor dies are enclosed within a cavity of the mold frame defined by a concave cylindrical inner sidewall of a wall member, wherein an inner surface of the mold frame corresponding to the cavity includes a group of protruded partitions extending from the inner surface toward the interface substrate;
    dispensing, through the mold frame, an encapsulant over the interface substrate and the stacks of semiconductor dies such that the encapsulant fills spaces between the stacks, the spaces corresponding to the dicing lanes; and
    displacing at least a portion of the encapsulant from the spaces.

11. The method of claim 10, wherein displacing the at least the portion of the encapsulant includes:
    pressing the mold frame toward the interface substrate such that the protruded partitions dislodges the at least the portion of the encapsulant from the spaces.

12. The method of claim 10, further comprising:
    placing a release film between the cavity and the encapsulant, wherein:
       the protruded partitions are arranged to orthogonally intersect each other to form a pattern of rectangles that each corresponds to one or more stacks of semiconductor dies; and
       a portion of the inner surface corresponding to a rectangle of the pattern includes at least one opening configured to provide vacuum suction to the release film.

13. The method of claim 10, further comprising:
    removing the mold frame from over the stacks of semiconductor dies; and curing the encapsulant at an elevated temperature to harden the encapsulant.

14. The method of claim 13, further comprising:
grinding to remove a portion of the encapsulant from over the stacks of semiconductor dies.

15. The method of claim 13, further comprising:
singulating the stacks of semiconductor dies from one another to form semiconductor die assemblies.

16. The method of claim 10, wherein the inner surface corresponding to the cavity is coated with a material having low surface energy.

\* \* \* \* \*